United States Patent [19]

Ichikawa et al.

[11] 4,445,132

[45] Apr. 24, 1984

[54] LED MODULE FOR A FLAT PANEL DISPLAY UNIT

[75] Inventors: Osamu Ichikawa; Tetsuo Sadamasa, both of Tokyo, Japan

[73] Assignee: Tokyo Shibaura Denki Kabushiki Kaisha, Kawasaki, Japan

[21] Appl. No.: 270,030

[22] Filed: Jun. 3, 1981

[30] Foreign Application Priority Data

Jun. 13, 1980 [JP] Japan ................................ 55-78938

[51] Int. Cl.³ .................... G01T 1/24; H01L 27/14; H01L 31/00; H01L 33/00
[52] U.S. Cl. .................................. 357/32; 357/17; 313/500; 340/719; 340/782; 340/815.01; 340/825.02; 358/241
[58] Field of Search .................. 340/782, 719, 815.01, 340/825.02; 313/500; 357/17, 32; 358/241

[56] References Cited

U.S. PATENT DOCUMENTS

| | | | |
|---|---|---|---|
| 3,783,353 | 1/1974 | Pankove | 357/17 |
| 3,942,065 | 3/1976 | Russ | 357/17 X |
| 4,011,575 | 3/1977 | Groves | 357/32 X |
| 4,322,735 | 3/1982 | Sadamasa et al. | 357/17 |

FOREIGN PATENT DOCUMENTS

| | | | |
|---|---|---|---|
| 51-38887 | 3/1976 | Japan | 357/17 |
| 55-67179 | 5/1980 | Japan | 357/17 |
| 2079049 | 1/1982 | United Kingdom | 357/17 |

OTHER PUBLICATIONS

Conference Record of 1978, *Biennial Display Research Conference*, SID, Oct. 24-26, 1978, pp. 18-19, T. Niina, S. Kuroda.
Conference Record of 1978, *Biennial Display Research Conference*, SID, Oct. 24-26, 1978, pp. 20-21, Ronald L. Hamis.
Niina et al., *IEEE Transactions on Electron Devices,* vol. ED-2, No. 8, Aug. 1979, pp. 1182-1186.
Levine, J. *IBM Technical Disclosure Bulletin,* vol. 19, No. 12, May 1977, pp. 4814-4815.

*Primary Examiner*—Andrew J. James
*Assistant Examiner*—Seth Nehrbass
*Attorney, Agent, or Firm*—Oblon, Fisher, Spivak, McClelland & Maier

[57] ABSTRACT

One surface of a substrate of an LED module for a flat panel display has 8×8 element areas divided into a matrix form. Row electrodes extend on element areas arranged along the row direction, and column electrodes insulated from the row electrodes extend on element areas arranged in the column direction. At least one LED pellet is disposed for each element area and is connected to the row and column electrode associated with this area. A connecting pad is disposed as spaced apart from the four pellets in a unit area defined as a region consisting of four element areas. This connecting pad is connected to one of the row and column electrodes in the four element areas and is also connected through the substrate to a connecting pin arranged on the other surface of the substrate of the LED module.

13 Claims, 27 Drawing Figures

F I G. 19
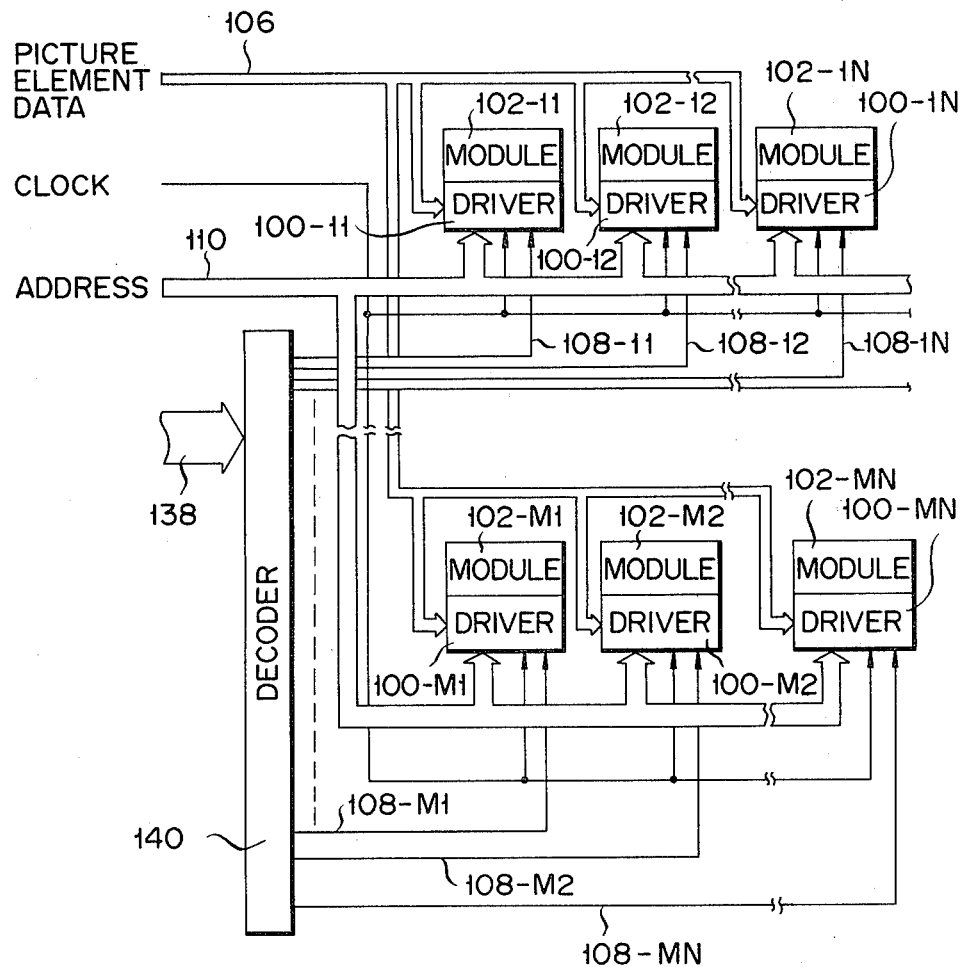

LED MODULE FOR A FLAT PANEL DISPLAY UNIT

BACKGROUND OF THE INVENTION

1. Field of the Invention

The present invention relates to an LED module for a flat panel display unit and, more particularly, to a plug-in type LED module wherein a number of LEDs are arranged in a matrix form.

2. Description of the Prior Art

A flat panel display unit for displaying letters, symbols, patterns, and so on is capable of being constructed small in size and allowing low power consumption as compared with a cathode-ray tube. It is, therefore, suitable for use as measuring equipment, office equipment, or a terminal for a computer. Flat panel display units are known which utilize electroluminescence, plasma or fluorescent display tubes, LEDs and so on. In particular, an LED display unit is considered to be promising as a flat panel display unit since the drivers for it may be simple in construction, multicolor display is possible, and the manufacturing cost may be reduced.

Since the picture elements, that is, the display points increase in number with an increase in the display area with a flat panel display unit, it is not easy to manufacture a single flat panel display unit having a great display area, and it is also difficult to repair the such single flat panel display unit. Thus, it has been proposed that a number of LED modules be combined to manufacture a flat panel display unit. However, such a combination has been unsuitable for conventional LED modules. An LED flat panel display device by T. Niina and S. Kuroda as described in the Conference Record of 1978, Biennial Display Research Conference, SID, Oct. 24-26, 1978, pages 18-19, is used as a single unit and is not intended for use in combination. In contrast with this, Ronald L. Harris describes an LED module in the Conference Record of 1978, Biennial Display Research Conference, SID, Oct. 24-26, 1978, pages 20 to 21, in which no LED pellets are arranged in a peripheral region having a width exceeding the pitch of the adjacent picture elements, that is, the display points. Therefore, with a flat panel display unit combining these modules, the pitch of the picture elements of the adjacent modules is different from the pitch of the picture elements inside the modules, possibly resulting in a distorted or unclear displayed image.

SUMMARY OF THE INVENTION

It is an object of the present invention to provide an LED module suitable for combination into a flat panel display unit.

It is another object of the present invention to provide a plug-in type LED module which is easy to replace and manufacture.

In order to achieve the above and other objects, the present invention provides an LED module for a flat panel display unit comprising:

a rectangular flat substrate having a number of unit areas located on one whole surface of said substrate in a matrix form, each of said unit areas consisting of four element areas located in matrix form;

a number of first column electrodes formed on the substrate and each extending along a column of said element areas;

a number of first row electrodes insulated from said first column electrodes and each extending along a row of said element areas;

a number of first LED pellets arranged respectively in said element areas and each electrically connected to one first column electrode and one first row electrode;

a number of connecting pads which are respectively arranged on said unit areas, which are spaced apart from said LED pellets respectively arranged on said four picture element areas respectively defining said unit areas and which are each electrically connected to one of said first column and row electrodes extending along the corresponding four element area; and a number of connecting pins each secured to the other surface of said substrate to project therefrom and respectively connected electrically to said connecting pads.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a plan view illustrating an LED module according to an embodiment of the present invention which has an 8×8 matrix of picture element areas for displaying monochromatic patterns or the like;

FIG. 19 is a block diagram schematically illustrating the system for flat panel display which combines a number of drivers as shown in FIG. 12.

DESCRIPTION OF THE PREFERRED EMBODIMENTS

Figure 1:
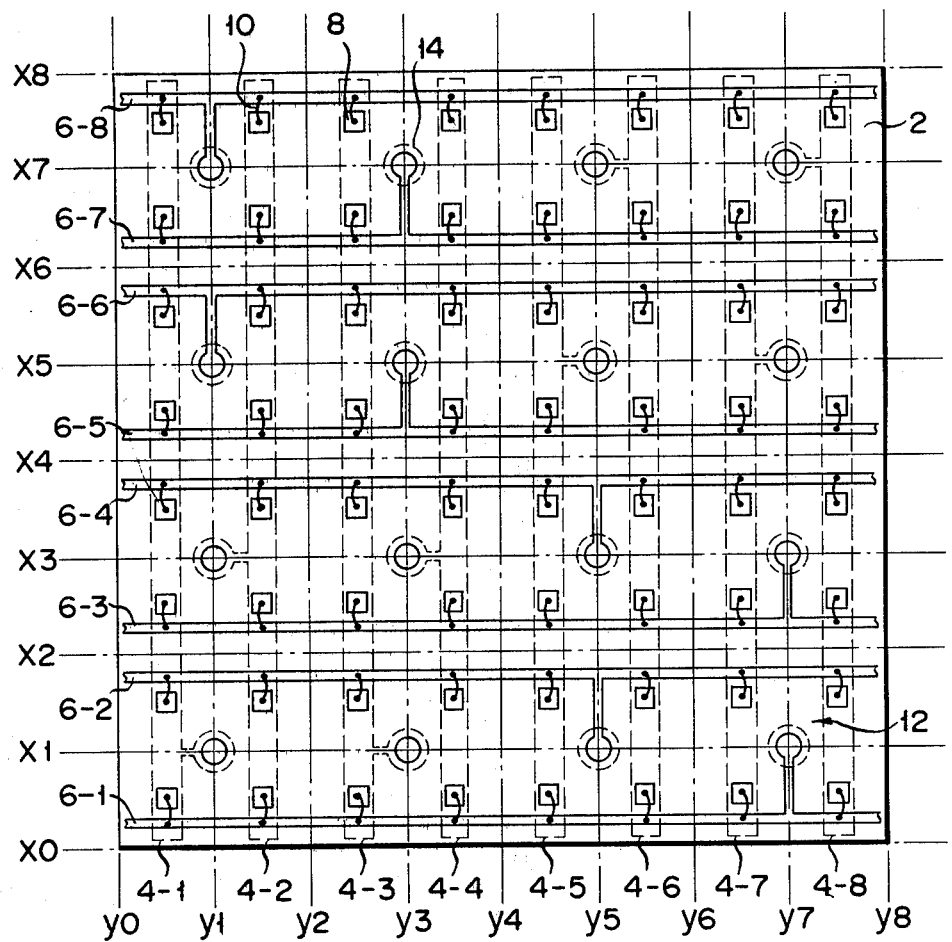

Referring now to the drawings, wherein like reference numerals designate identical or corresponding parts throughout the several views, and more particularly to FIG. 1 thereof, FIG. 1 shows an LED module for displaying monochromatic images according to an embodiment of the present invention. The outer dimensions of this LED module are preferably 10.16×10.16 mm, and the surface of it is divided into 8 columns and 8 rows to provide 64 picture element areas 2. Referring to FIG. 1, the unit picture element areas 2 are defined as regions divided by alternate long and short dash lines x0 to x8 and y0 to y8, and the dimensions of each region are about 12.7 mm×1.27 mm. Below the respective column picture element areas of each row extend column electrodes 4-1 to 4-8 spaced apart from each other, as shown in the figure. Similarly, on each row of the picture element areas 2 are arranged row electrodes 6-1 to 6-8 as spaced apart from each other and insulated from the column electrodes 4-1 to 4-8. At substantially the center of each picture element area 2 is mounted an LED pellet 8, such as a GaP LED emitting red light, as the picture element or display point, one pole of the LED pellet 8 being electrically connected to the column electrode disposed below the corresponding picture element area 2 and the other pole being electrically connected to the row electrode disposed on the corresponding picture element area 2 through Au wire 10. The dimensions of each LED pellet 8 are generally 0.3 mm×0.3 mm, its height is 0.3 mm, and its volume is about 900 $\mu m^3$. Since the LED pellets 8 are arranged substantially at the centers of the picture element areas 2, the distance between adjacent LED pellets 8, that is, the pitch of the display points, is determined to be about 1.27 mm. The surface of the LED module is divided into unit areas 12 for defining the positions at which connecting pins are to be securely fixed. Each unit area 12 consists of a 2×2 matrix of picture element areas 2. In other words, each picture element area 2 corresponds to the area obtained by dividing the surface of the LED module into an n×n matrix of unit areas 12 and further dividing each unit area 12 into a 2×2 matrix of element areas 2. Connecting points or connecting pads 14 having a diameter of 500 $\mu m$ are arranged at the centers of the respective unit areas 12, that is, at the intersections of lines x0 to x8 and y0 to y8. It follows from this that the pitch of the connecting points 14 is determined to be 2.54 mm. Each of the connecting points 14 is electrically connected to either the row electrode or the column electrode extending on or below the unit 12 corresponding to this connecting point 14. The connecting points 14 are electrically connected to connecting pins arranged at the underside of the module. Therefore, the pitch of the connecting pins is also 2.54 mm.

Figure 2:
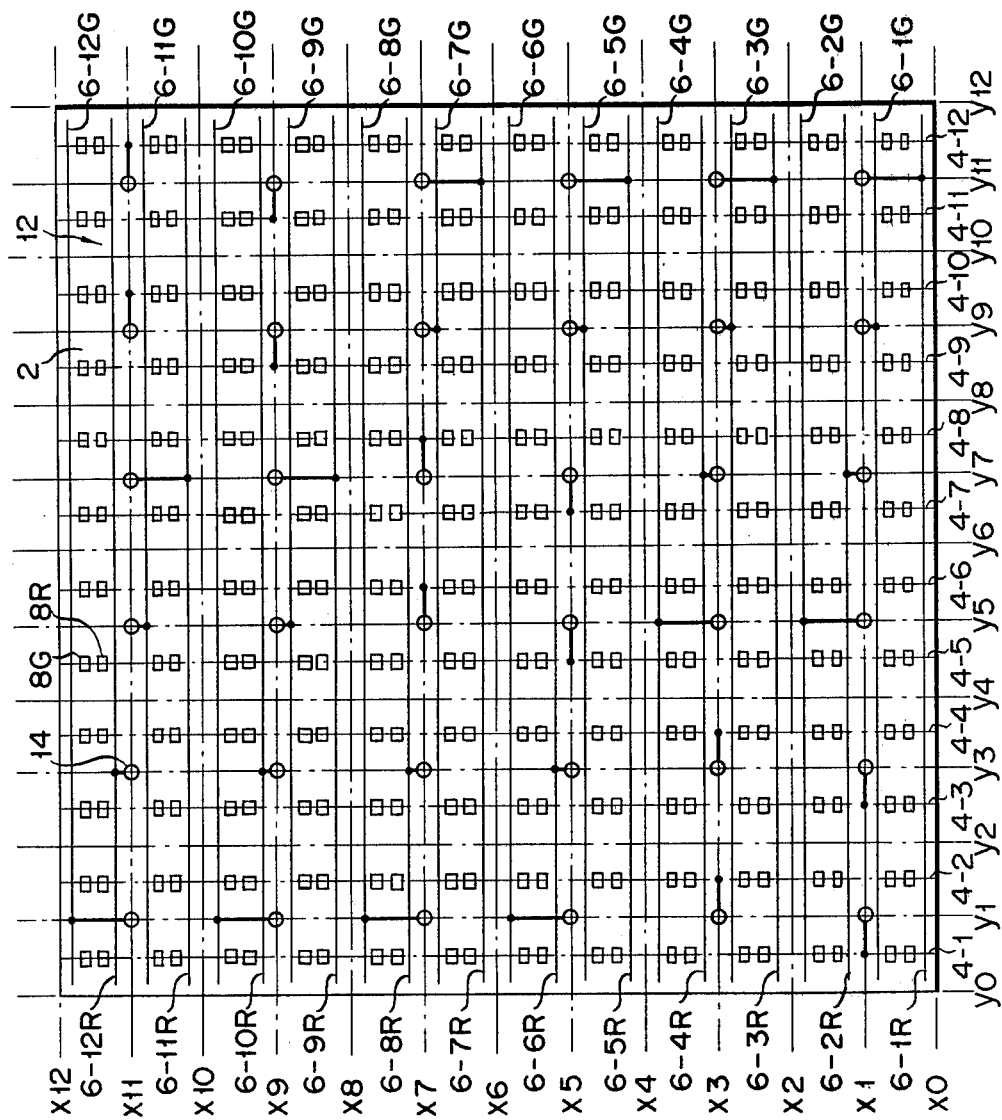
FIG. 2 is a model plan view illustrating the surface of an LED module according to another embodiment of the present invention which has 12×12 picture element areas for displaying patterns or the like in two colors.
Figure 3:
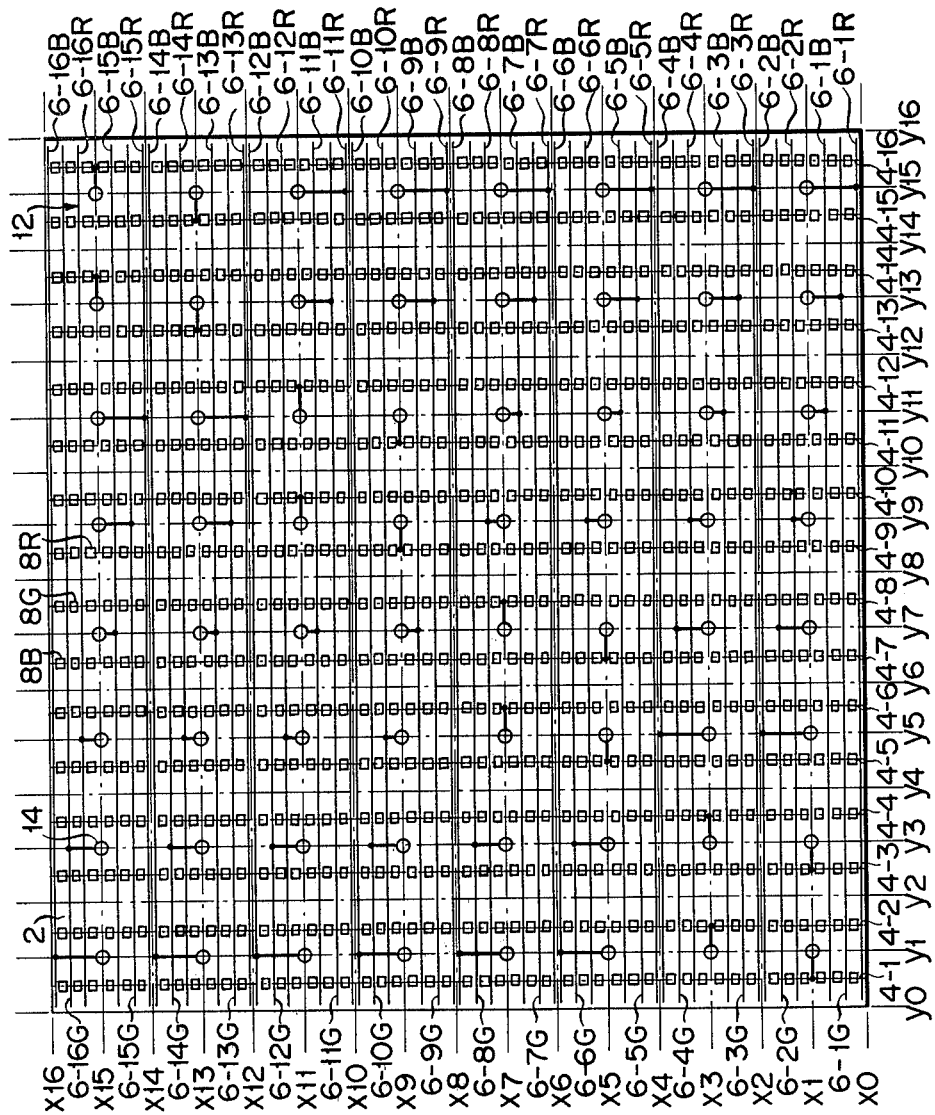
FIG. 3 is a model plan view illustrating the surface of an LED module according to still another embodiment of the present invention which has 16×16 picture element areas for displaying patterns or the like in three colors.
Figure 4:
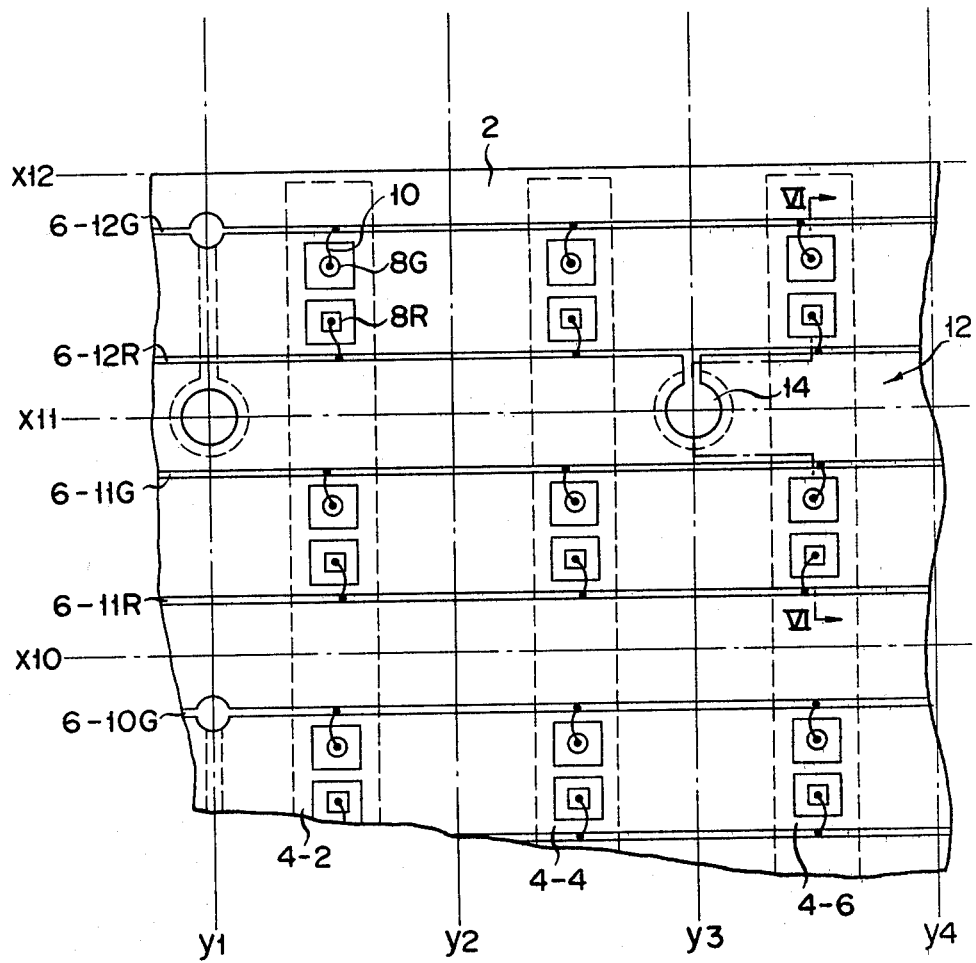
FIG. 4 is an enlarged plan view of part of FIG. 2.
Figure 5:
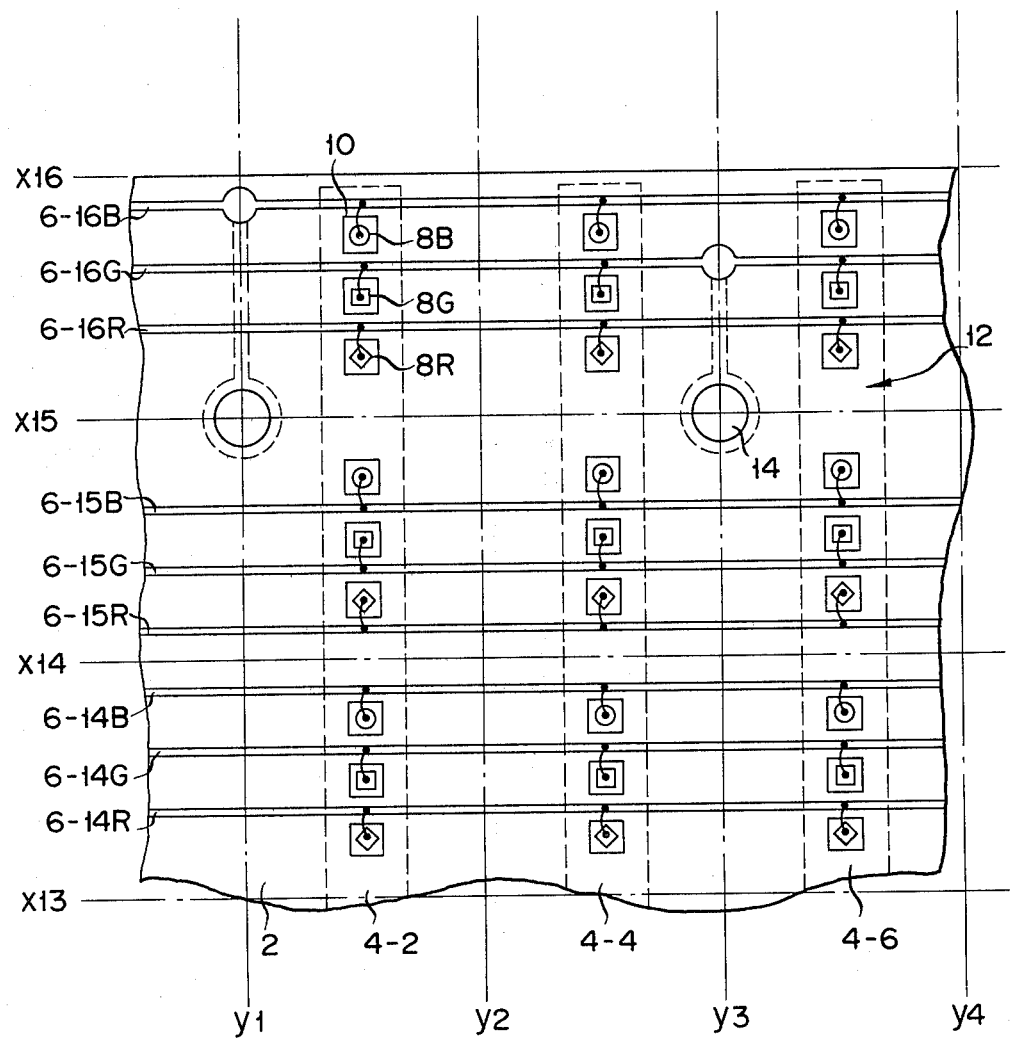
FIG. 5 is an enlarged plan view of part of FIG. 3.

FIGS. 2 and 3 show LED modules according to other embodiments of the present invention. The same reference numerals denote the same parts and the detailed description thereof will be omitted. The LED module shown in FIG. 2 consists of a 12×12 matrix of picture element areas 2 to each of which are mounted an LED pellet 8R for emitting red light and an LED pellet 8G for emitting green light, as may be seen in FIG. 4 which is an enlarged view of part of FIG. 2. Along the respective rows of picture element areas 2 extend in the row direction paired row electrodes 6-1R to 6-12R and 6-1G to 6-12G in correspondence with LED pellets 8R and 8G. Alternatively, instead of the paired row electrodes, paired column electrodes may extend below the respective picture element areas 2. On the surface of the LED module shown in FIG. 2, a connecting point or connecting pad 14 as previously mentioned is arranged inside each unit area 12 consisting of a 2×2 matrix of picture element areas 2. Each connecting point 14 is connected to one of the column electrodes and the row electrodes inside the corresponding unit area. The LED module shown in FIG. 3 consists of a 16×16 matrix of picture element areas 2 to each of which are mounted an LED pellet 8R for emitting red light, an LED pellet 8G for emitting green light, and an LED pellet 8B for emitting blue light, as shown in FIG. 5 which is an enlarged view of part of FIG. 3. Three sets of row electrodes, 6-1R to 6-16R, 6-1G to 6-16G and 6-1B to 6-16B, extend in the row direction on the respective picture element areas 2 in correspondence with the LED pellets 8R, 8G and 8B. Alternatively, three sets of column electrodes may extend below the respective element areas 2, instead of the three sets of row electrodes. In the LED module shown in FIG. 3, inside each unit area 12 comprising a 2×2 matrix of picture element areas on the surface of the LED module is formed one of the connecting points 14, and this connecting point 14 is connected to one of the column electrodes (or the row electrodes) inside the corresponding unit area.

The connecting points 14 shown in FIGS. 1, 2 and 3 are arranged at equal intervals and are each connected to different ones of the column and row electrodes. The correspondence relationship between the connecting points 14 and the electrodes to which they are connected is not limited to that shown in the drawing but may be varied. For example, referring to FIG. 1, the connecting points 14 located symmetrically about the alternate long and short dash lines y4 and x4 as reference lines may be alternately connected to row and column electrodes.

In the embodiments described above, one connecting point 14 is arranged inside each unit area 12 consisting of a 2×2 matrix of picture element areas 2 for the reasons to be described below. It is necessary with an LED module to incorporate connecting pins to be connected to a number of row and column electrodes. However, it is disadvantageous to form the region for arranging the connecting pins at the periphery of the LED module separately from the picture element areas. If such a region is formed at the periphery of the LED module, when a number of LED modules are mounted to a panel socket, areas are formed between the adjacent LED modules where the picture element areas 2 are not formed, resulting in a greater distance or discontinuity between some display points and a disturbance in the display pattern or the like. For this reason, the display surface of the LED module must be divided into picture element areas 2 of equal area, and the connecting pins must be arranged at the underside of each LED module. The connecting points 14 to which these connecting pins are connected must be arranged at such locations so as to avoid contact with the LED pellets 8. Such locations are inside the unit areas 12 each defined by four of the picture element areas 2. When the connecting points 14 are arranged inside each unit area 12, the distance between the connecting points 14 may be kept substantially constant and the distance between the connecting pins may also be kept substantially constant. As a result, the strength of the LED module may be sufficiently improved, and the distance between the connecting pins may be made to correspond with the distance between through holes formed in the panel socket to which the LED modules are to be mounted. The distance between the through holes of the panel socket is generally in units of inches and is equal to 1.27 or 2.54 mm. Therefore, in the embodiment of the present invention, the picture element area is of 1.27 mm × 1.27 mm size, and the distance between the connecting points 8 or the connecting pins is maintained at 2.54 mm.

Furthermore, when only the LED pellet 8 is mounted on each picture element area 2, it is required that an LED module is constituted by at least a 8×8 matrix of picture element areas 2. Likewise, for two LED pellets 8 mounted on each picture element area 2, it is required that an LED module be constituted by at least a 12×12 matrix of picture element areas 2 and for three LED pellets 8 mounted on each picture element area 2, it is required that an LED module be constituted by at least a 16×16 matrix of picture element areas. The reasons for this follow.

In the general matrix connection, the condition for minimizing the number of column and row electrodes with respect to the number of intersections is to make the number of row and column electrodes equal. Where NC is the number of column electrodes and NR is the number of the row electrodes, the number NP of the connecting pins is NR+NC. The relation of ND=NR·NC may also hold, where ND is the number of picture elements, if the number of intersections of the column and row electrodes is the same as the number of picture elements. On the other hand, the number of the connecting pins NP changes according to the number of pellets to be arranged inside each picture element; NP1=NR+NC when the number of pellets arranged inside each picture element is 1, NP2=2NR+NC or NP2=NR+2NC when it is 2, and NP3=3NR+NC or NP3=NR+3NC when it is 3. According to the present invention, four picture elements are arranged for one connecting pin, therefore 4NP=ND. As has been described earlier, it is preferable that NR=NC for obtaining the maximum number of picture elements with a minimum number of connecting pins. Therefore, ND=NR$^2$ or ND=NC$^2$. Thus, when the relation is developed for NP1, NP2 and NP3, NR$^2$=4NP1=4(2NR)=8NR, or NC$^2$=4NP1=4(2NC)=8NC, and therefore NR or NC becomes 8 for NP1. For NP2, NR$^2$=4NP2=4(3NR)=12NR, or NC$^2$=4NP2=4(3NC)=12NC, and therefore NR or NC becomes 12. Similarly, for NP3, NR$^2$=4NP3=4(4NR)=16NR, and therefore NR or NC becomes 16.

Figure 6:
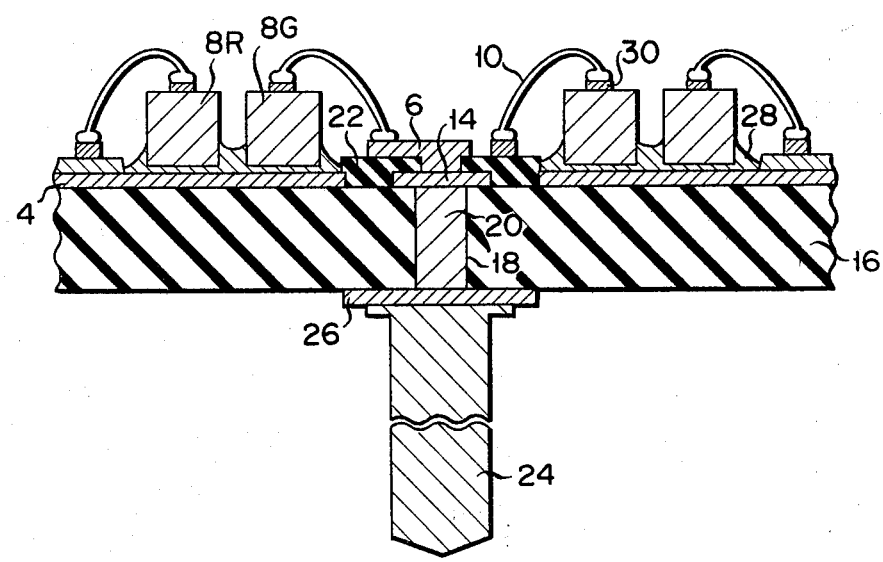
FIG. 6 is a sectional view along the line VI—VI of FIG. 4.

The method for manufacturing the LED module shown in FIGS. 2 and 4 will be described referring to FIG. 6 which shows a section along the line VI—VI of FIG. 4.

First, a number of through holes 18 are formed in a sheet-like ceramic substrate 16 of alumina or the like and having a thickness of 0.5 to 2 mm. Conductive metal such as Au paste is filled in each of these through holes 18. Thereafter, the substrate 16 is fired to provide a modular substrate having embedded electrodes 20. Au paste or the like is printed on this modular substrate to form the column electrodes 4 of predetermined pattern and 0.5 to 5 μm thickness. Insulative layers 22 are further formed thereover by printing and firing insulative material except those portions where the LED pellets 8R, 8G and the connecting points or pads 14 are to be formed. Au paste or the like is printed on the portion of the embedded electrode 20 where the insulative layers 22 are not formed, to form the connecting points or pads 14. A predetermined connecting point or pad 14 is connected to the column electrode 4 extending to the embedded electrode 20, and therefore a predetermined embedded electrode 20 is connected to the column electrode 4. Row electrodes 6 on a predetermined pattern are formed on the insulative layers 22 and are connected to the predetermined connecting points 14. Simultaneously, conductive pads 26 for positioning and fixing connecting pins 24 on the underside of the substrate are also formed. Then, the connecting pins 24 obtained by Au-plating an alloyed metal, such as Kovar (TM), of 500 μm diameter and 5 mm length are fixed to the conductive pads 26 with silver solder (not shown) on the underside of the substrate. Assembly processes such as mount bonding are then performed using the resultant substrate. First, a conductive adhesive 28 such as silver solder is dropped on predetermined portions of the column electrodes 4 where the insulative layers 22 are not formed, and the LED pellets 8 are mounted thereon. Annealing is performed at about 150° C. for about 60 minutes to adhere the LED pellets 8 to the substrate 16. Next, the LED pellets 8 and the row electrodes 6 are bonded using the Au wire 10 to provide an LED module.

Figure 7:
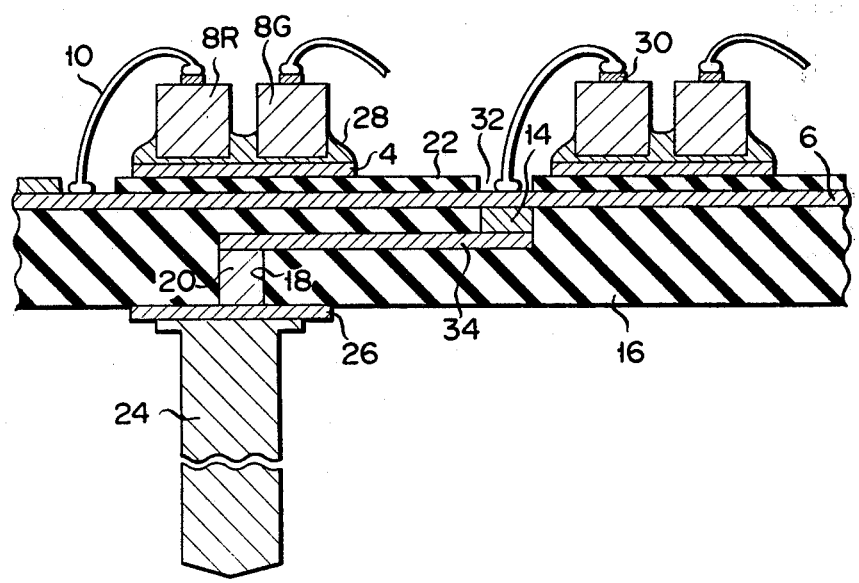
FIGS. 7 to 11 are sectional views illustrating various other modifications of the present invention which are of structures different from the structure shown in section in FIG. 6.

FIG. 7 is a sectional view of an LED module according to another embodiment of the present invention wherein the construction of the substrate is improved. As the number of picture element areas 2 arranged on the substrate 16 increases, the column and row electrodes 4 and 6 become elongated, and the resistances of the electrodes 4 and 6 as current paths correspondingly increase. In such a case, the resistance of the row electrodes 6 for combining the current coming from the signal line is more important than the resistance of the column electrodes 4 as the signal line. In order to solve this problem, it is possible to increase the thickness or the pattern width of the row electrodes 6. However, the maximum value of the thickness or the pattern width of the row electrodes 6 is limited depending on the number of wires or the picture element area pitch. In order to compensate for this, as shown in FIG. 7, the row electrodes 6 are formed on the insulative substrate 16, and the column electrodes 4 are formed on the insulative layer 22 formed on the row electrodes 6. Then, the LED pellets 8R and 8G are placed on the column electrodes 4 where the row electrodes 6 and the column electrodes 4 overlap each other, and are bonded with the Au wire 10 connecting an electrode 30 of the LED pellet with the row electrode 4 exposed through an opening 32 formed at a predetermined portion of the insulative layer 22. With such a structure where the wirings of the column and row electrodes alternate, the thickness or the width of the wiring pattern may be increased. The connecting pin 24 is not required to be arranged on the part of the underside of the substrate substantially corresponding to the center of the four picture elements. The positions of the connecting pin 24 and the connecting pad or point 14 may be freely set by arranging an internal connecting strip 34 inside the insulative substrate 16.

Figure 8:
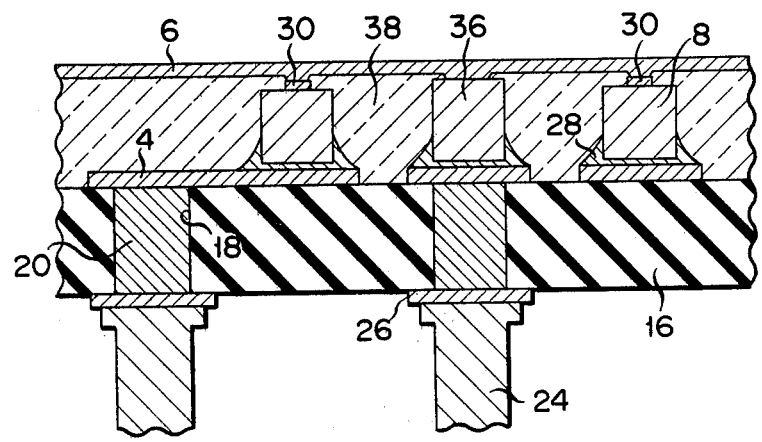

Still another embodiment of the present invention will now be described wherein the resistance of the row electrodes 6 is minimized, with reference to FIG. 8.

The desired column electrode 4 and the conductive pad 26 are formed by printing Au paste or the like on the front or rear surface of the modular substrate 16 having the embedded electrode 20. The connecting pin 24 is connected to the conductive pad 26 with silver solder or the like.

The LED pellet 8 of dimensions 0.3 (length)×0.3 (width)×0.3 (height) mm and a conductive rod 36 of 0.4 mm diameter and 0.3 mm height obtained by Au-plating an alloyed metal, such as Kovar (TM), are bonded to the predetermined portions of the column electrode 4 on one surface of the substrate with the conductive adhesive 28 such as silver solder. Next, a thermoplastic resin 38, such as polyfluoroethylene propylene (FEP), of flat shape and of about 0.5 mm thickness is covered over the structure at 300° C. and 10 kg/cm$^2$ to embed the LED pellets and the conductive rod 36. A hole is formed at predetermined portions of the electrode 30 of the LED pellet 8 and the conductive rod 36, and the row electrode 6 is formed on the surface of the region using the technique of vacuum evaporation, plating or photoetching, thus completing the display device. According to this embodiment, the row electrode 6 having sufficient width and thickness may be formed.

Figure 9:
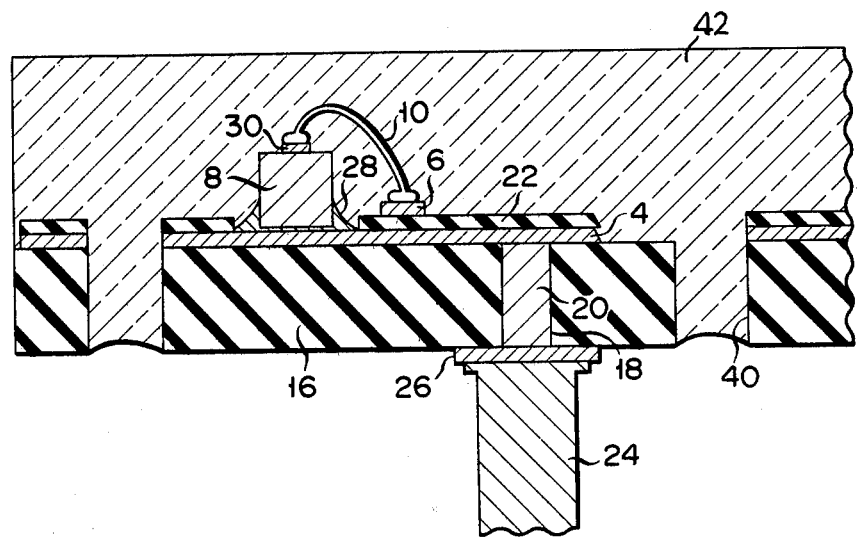
Figure 10:
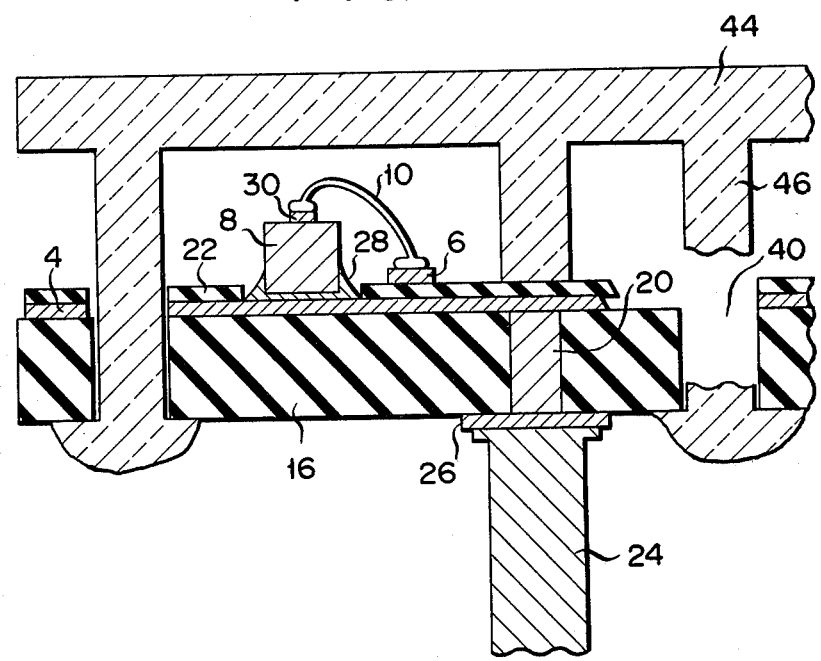
Figure 11:
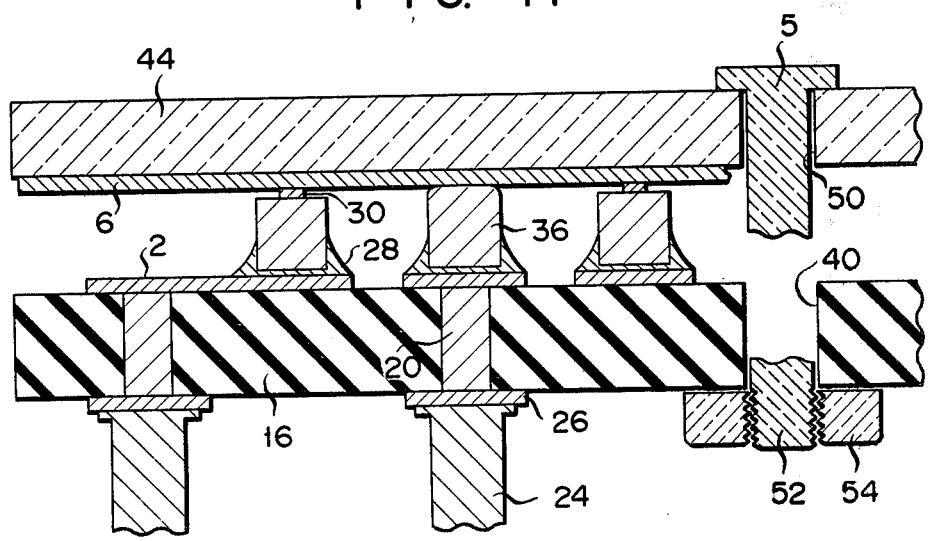

FIGS. 9 to 11 show embodiments wherein the LED modules are packaged. In the packaged LED module shown in FIG. 9, a through hole 18 having a diameter of 0.4 mm for forming the embedded electrode 20, and an additional through hole 40 having a diameter of 0.6 mm, are formed in the insulative substrate 16. As with the LED modules shown in FIGS. 6 and 7, on the underside of the insulative substrate 16 are formed the conductive pad 26 connected to the embedded electrode 20 and the connecting pin 24 fixed to the conductive pad 26. The column electrode 4 is formed on the insulative substrate 16, and the LED pellet 8 is mounted on the column electrode 4 with the silver conductive adhesive paste 28. An insulative layer 22 is formed thereover. The row electrode 6 is formed on the insulative layer 22. The row electrode 6 and the electrode 30 of the LED pellet 8 are connected through the Au wiring 10. After an assembly of such a structure is formed, it is placed inside a container (not shown) which can hold the insulative substrate 16 facing its surface toward the bottom surface of the container. A mold material 42 such as an epoxy resin is injected through the through hole 40. After the mold material 42 has hardened, the structure is taken out of the container to provide a packaged LED module as shown in FIG. 9.

FIG. 10 shows another embodiment of the packaging method which utilizes the additional through hole 40 as in the case of FIG. 9. A flat transparent plate 44 of polycarbonate material having a thickness of about 1 mm is mounted to cover the surface of the substrate. A pin 46 is formed at the part of the flat transparent plate corresponding to the through hole 40. This pin 46 is inserted in the through hole 40. The part projecting from the underside is caulked with a heating head at 150° C. to integrally form the substrate with the flat transparent plate, thereby providing a package.

Referring to FIG. 11, the row electrode 6 formed on one surface of the flat transparent plate such as a glass plate 44 is connected under pressure to the conductive rod 36. The substrate 16 and the flat transparent plate 44 are integrally formed with a transparent bolt 52 a transparent nut 54 inserted in through holes 50 and 40 formed in the flat transparent plate 44 and the substrate 16. The row electrode 6 is connected to the conductive rod 36. From the beginning, this transparent bolt may be integrally formed with the flat transparent plate.

In the embodiment described above, the additional through hole 40 is formed at the part of the substrate 16 where the connecting point 14 shown in FIGS. 2 and 3 is to be formed. Although only one LED pellet is mounted to each picture element area, 12×12 picture element areas constitute one LED module, and additional through holes are formed at the positions of the substrate 16 which are not used for the connecting points. The same applies to the case wherein 16×16 picture element areas constitute one LED module and 2 LED pellets are mounted to each picture element area.

The material for the insulative substrate in the embodiments described above is not limited to ceramic but may also be a glass epoxy material, a polyimide resin material, or a metal plate having predetermined portions treated for insulation. The adhesive used for fixing the LED pellets is not limited to silver paste but may be solder or other conductive adhesives. When the LED pellets are of planar type, a general adhesive may also be used.

The number of picture element areas, the number of through holes, the distance between the picture elements, and the arrangement of the connecting pins are not limited to the particular embodiments described above, and various other modifications may be made depending on the type of display device to be manufactured or the peripheral equipment. Only the required functions need be performed.

Figure 12:
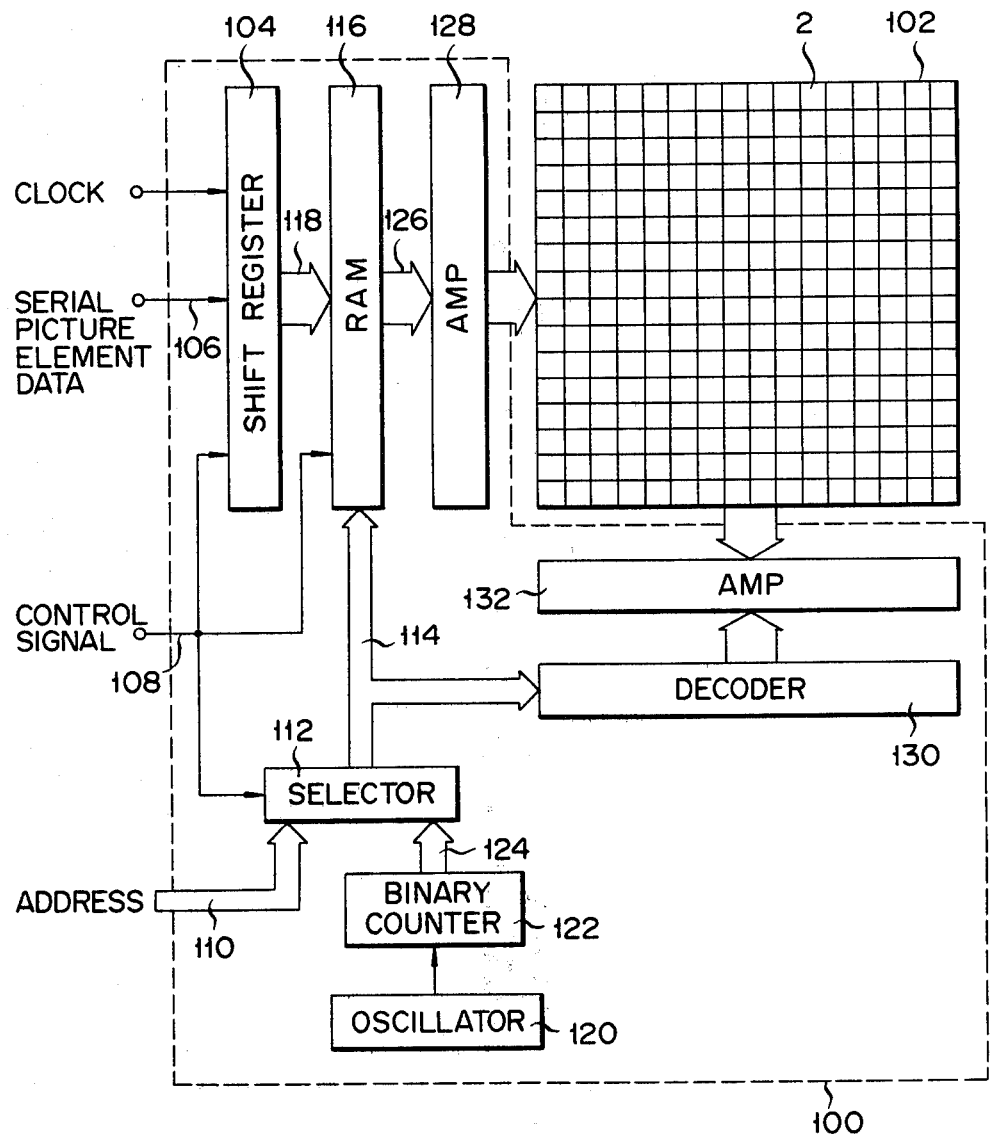
FIG. 12 is a block diagram of a driver for driving the LED module having 16×16 picture element areas.
Figure 13:
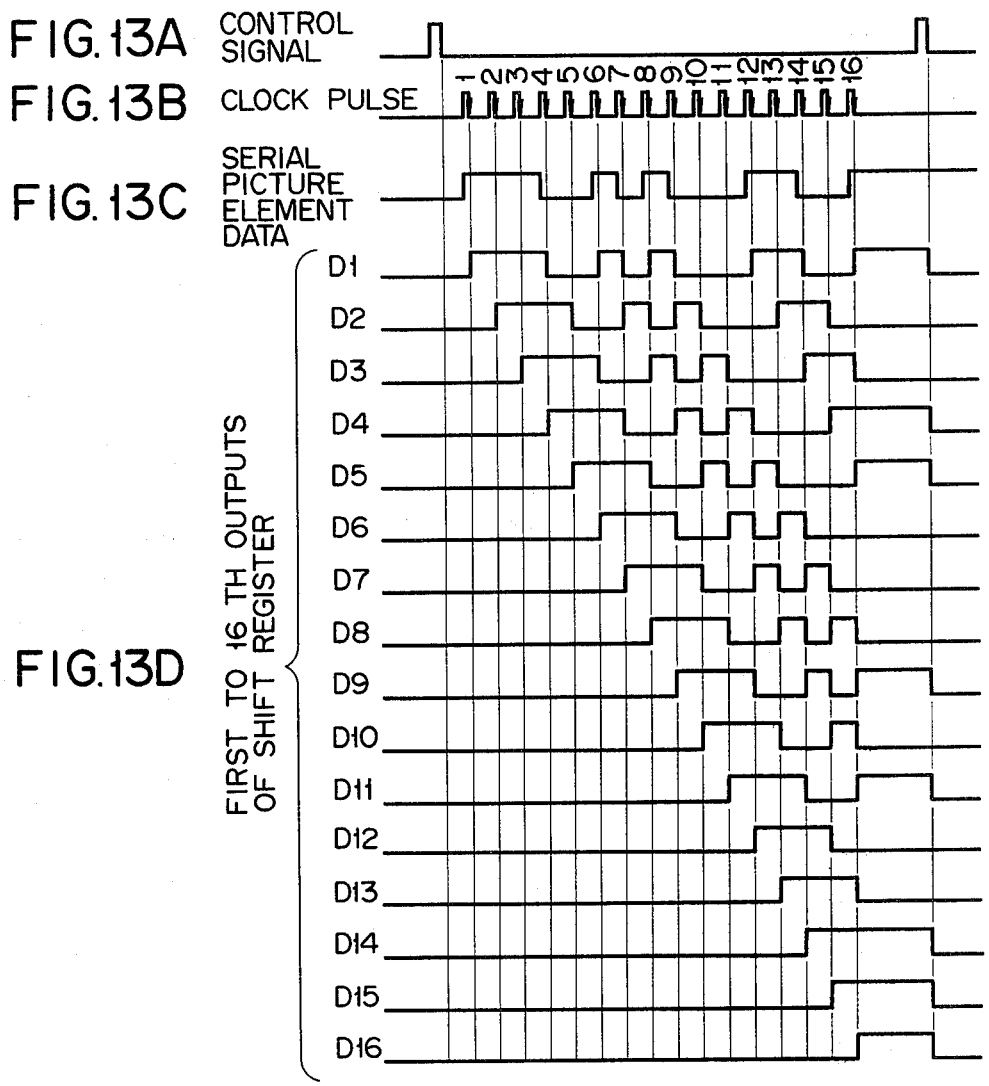
FIGS. 13A to 13D, 14A to 14D, and 15A to 15C are timing charts showing signals supplied to the respective blocks shown in FIG. 12.
Figure 14:
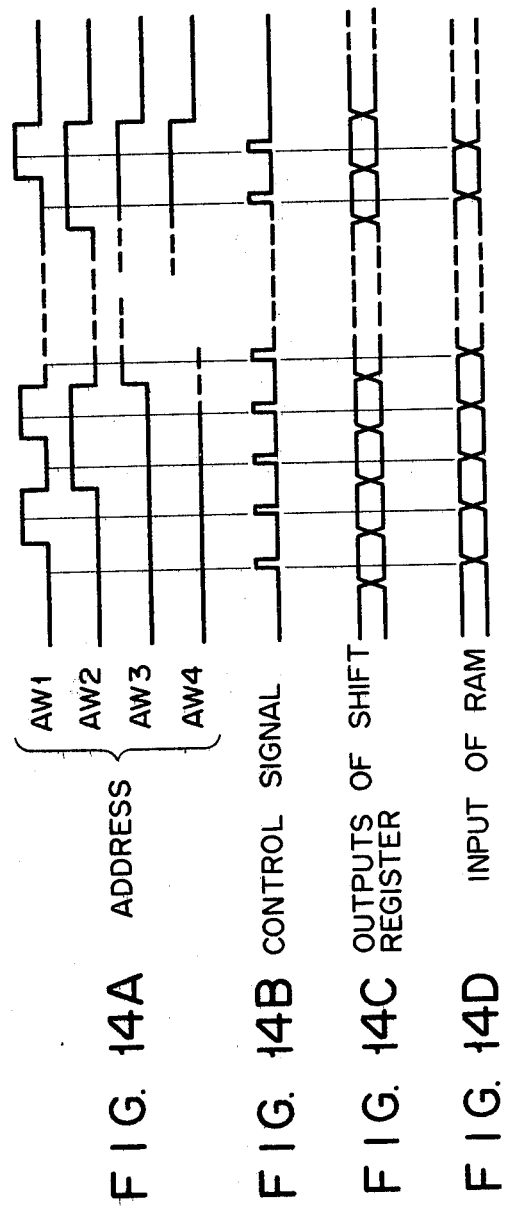
Figure 15:
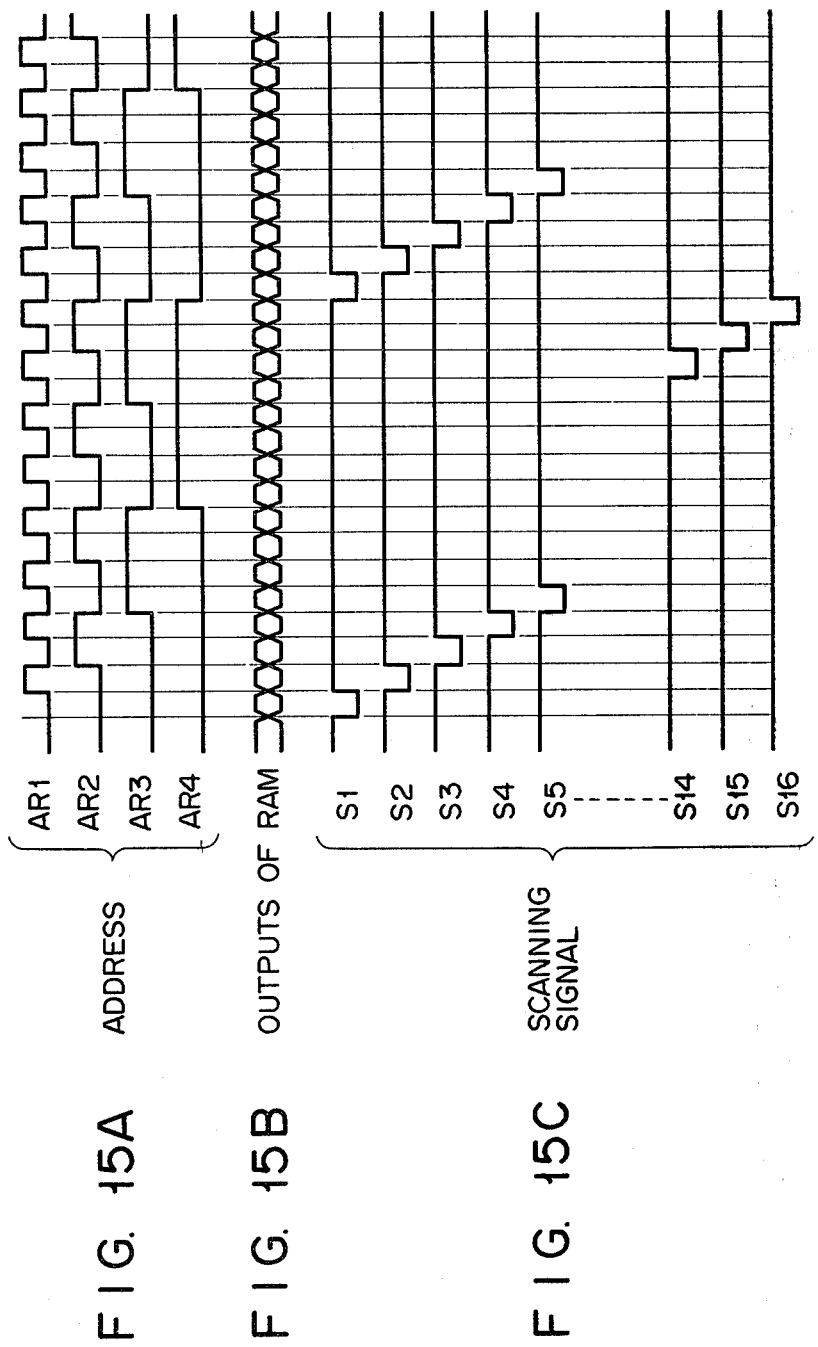

A driver 100 for driving the LED display module will be described with reference to FIGS. 12 to 19. FIG. 12 shows an LED module 102 wherein the picture element areas 2 are arranged in a matrix form of 16 columns and 16 rows. As will be described hereinafter, the LED module 102 may display a pattern or the like in two or three colors. However, for the sake of simplicity, a monochromatic LED pellet (not shown) is arranged for each picture element area for displaying a pattern or the like in monochrome. Therefore, the LED module 102 shown in FIG. 12 may have 16 columns and 16 rows by itself, or four LED modules may be combined, each having 8 columns and 8 rows as shown in FIG. 1. As shown in FIG. 13C, picture element data is supplied serially through a serial data line 106 from an external unit in synchronism with a clock pulse as shown in FIG. 13B to a shift register 104 of the driver 100 after the shift register is cleared by the trailing edge of a control signal as shown in FIG. 13A which is supplied through a control signal line 108. The shift register 104 converts the serial data into parallel data D1 to D16 of 16 bits, as shown in FIG. 13D. These converted parallel data D1 to D16 are stored in predetermined locations of a RAM 116 in response to 4-bit writing addresses AW1 to AW4 supplied from an external unit through an address line 110, a selector 112 and an address line 114 in synchronism with a control signal supplied through the control signal line 108. When a control signal as shown in FIG. 14B is supplied to the RAM 116 while the 4-bit writing addresses AW1 to AW4 shown in FIG. 14A are being supplied through the address line 114, the outputs from the shift register 104 as shown in FIG. 14C are sequentially supplied to the RAM 116, as shown in FIG. 14D, through a data bus 118. The 16-bit picture element data is stored in the RAM 116 with the addresses at the leading edges of the control signal. The 16-bit picture element data D1 to D16 supplied to the ROM 116 include information on which row of 16×16 picture elements is to be lit, and the writing 4-bit addresses AW1 to AW4 include information on which column of the LED module 102 is to be lit. Therefore, the RAM 116 consists of 16 bit-16 word memory and the address designates the location at which one word is stored.

A binary counter 122 counts clock pulses of 50 kHz generated from an oscillator 120 and sequentially generates 4-bit reading addresses AR1 to AR4 as shown in FIG. 15A. The generated addresses AR1 to AR4 are supplied to the address line 114 since the selector 112 selects an address line 124 when the control signal of the control signal line 108 is in 0-bit state. When the control signal is of 1-bit state, the address line 110 is selected by the selector 112, and the writing addresses AW1 to AW4 are supplied to the address line 114. Therefore, when the control signal as shown in FIG. 14B is supplied to the selector 112, the writing addresses AW1 to AW4 or the reading addresses AR1 to AR4 is supplied to the RAM 116. When a certain amount of the row picture element data D1 to D16 is stored in the RAM 116 at the writing addresses AW1 to AW4, and when the reading addresses AR1 to AR4 coincide with the addresses in which the row picture element data D1 to D16 are stored, the row picture element data D1 to D16 are supplied to a row amplifier 128 from the RAM 116 through a data bus 126. At this instant, the reading addresses AR1 to AR4 are also supplied to a decoder 130 which decodes these addresses to generate scanning signals S1 to S14 of designated columns, as shown in FIG. 15C. These scanning signals are supplied to a column amplifier 132. The row amplifier 128 comprises, for example, a TTL circuit and series resistors to generate a peak current of 15 mA per bit and supplies a current to a predetermined one of the 16 row electrodes for energizing the LED pellet of the LED module 102. At this instant, since the predetermined column designated by the decoder 130 is kept at low level by the column amplifier 132, a row signal current flows from the row electrode to the LED pellet of a predetermined column for lighting the LED pellet. The column amplifier 132 is capable of receiving a maximum current of 15 mA×16=240 mA from the designated column. Therefore, even when a current of 15 mA is supplied from the row electrode to all the LED pellets of a certain column electrode, these LED pellets may be lit.

When the reading addresses AR1 to AR4 as shown in FIG. 15A are sequentially supplied through the selector 112 and the address line 114 as described above, the row picture element data D1 to D6 is supplied from the RAM 116 to the row amplifier 128 as shown in FIG. 15B. The sequentially generated reading addresses AR1 to AR4 are decoded by the decoder 130, and the scanning signals for designating the columns are generated as shown in FIG. 15C. Thus, the LED pellets are sequentially lit for each column to display a predetermined pattern.

The RAM 116 shown in FIG. 12 holds the stored data in the memory locations designated by the writing addresses until new picture element data is stored. Therefore, by supplying the reading addresses to the RAM 116 at desired times, it is possible to display with the LED module 102 the data stored in the RAM 116 the corresponding times. Furthermore, it is also possible to change part of the shape of the pattern displayed at the LED module 102 by renewing the data by storing predetermined picture element data into predetermined memory locations of the RAM 116 in response to predetermined writing addresses while holding the data in the other memory location unchanged.

Figure 16:
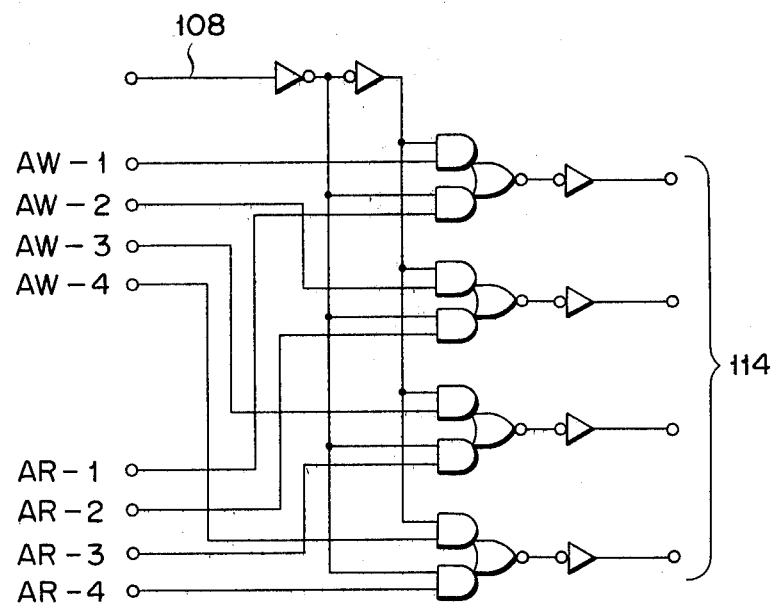
FIGS. 16 and 17 are respective circuit diagrams illustrating an embodiment of a selector shown in FIG. 12.
Figure 17:
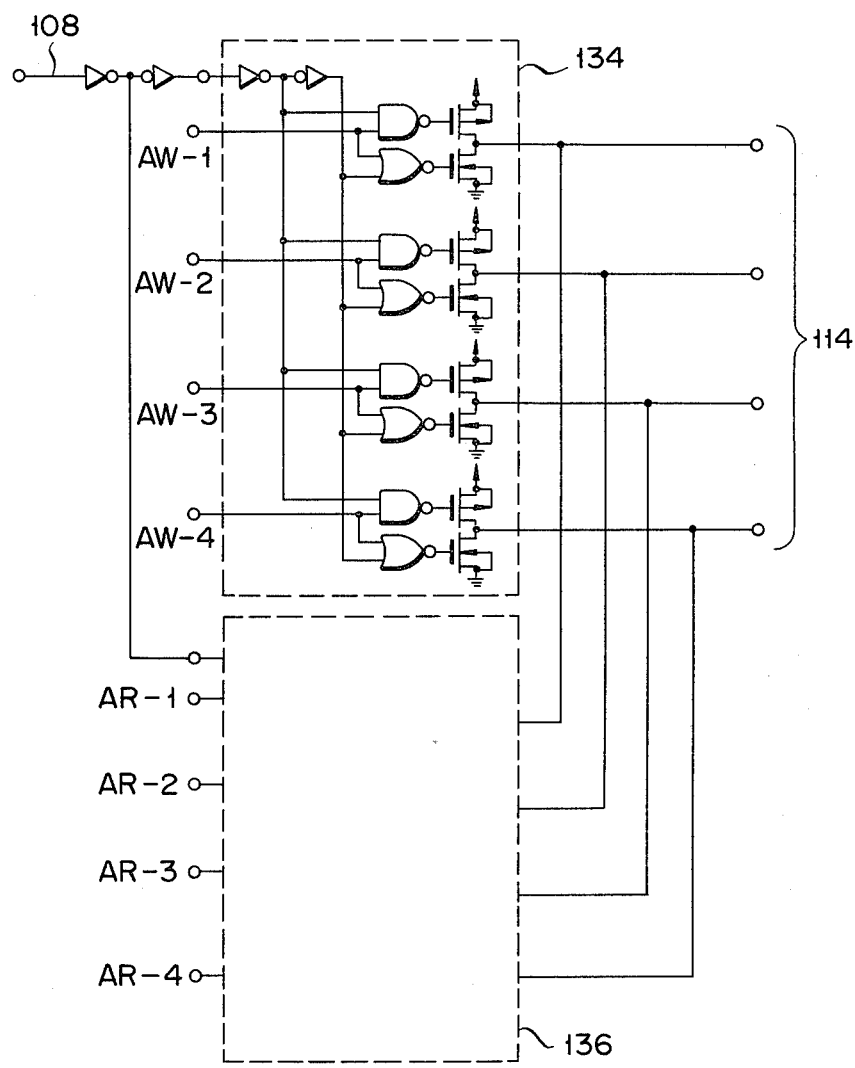
Figure 18:
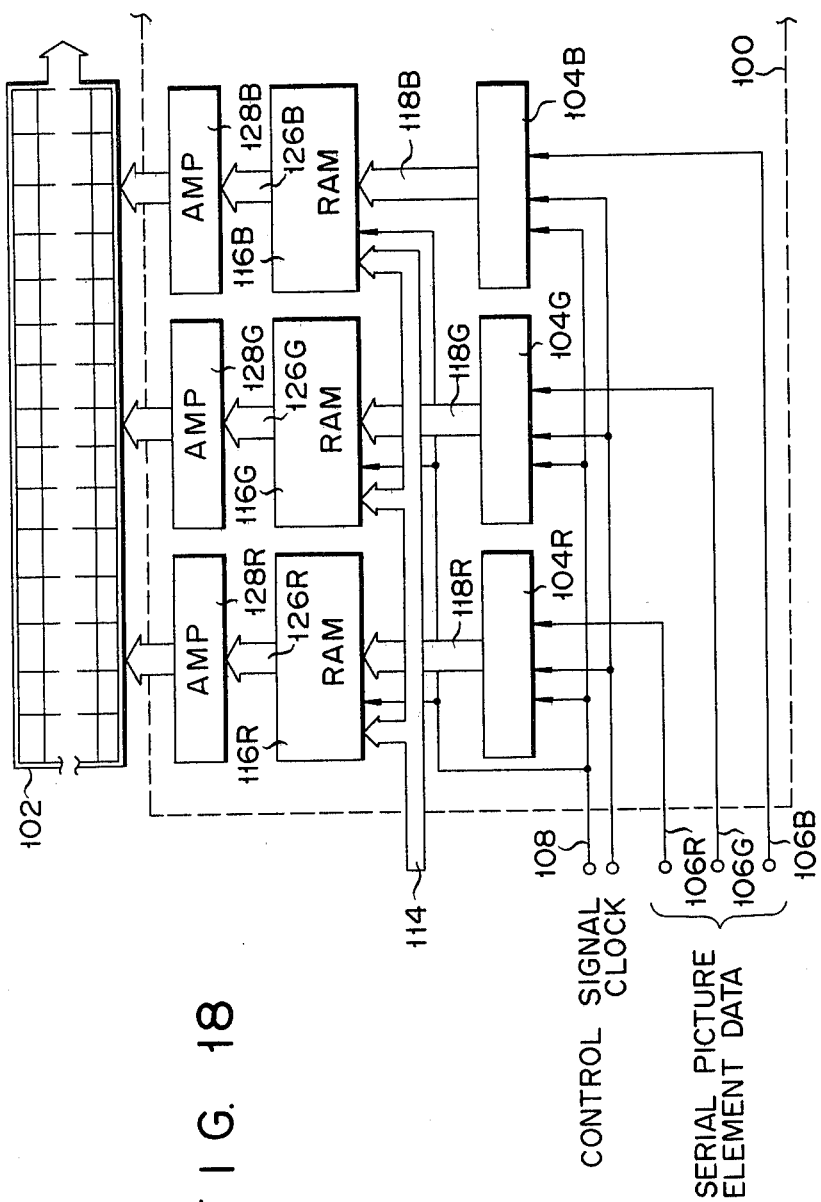
FIG. 18 is a block diagram illustrating the system according to the modification shown in FIG. 12.

The selector 112 shown in FIG. 12 may be of quad AND-OR gate construction as shown in FIG. 16 or may be of a construction which combines two 3-state non-inverting buffers 134 and 136 for connecting the outputs as shown in FIG. 17. The system is constructed as shown in FIG. 18 when three LED pellets for emitting three different colored light rays are included in one picture element area of the LED module 102. Thus, RAMs 116R, 116G and 116B are incorporated in correspondence with the respective LED pellets. Three row amplifiers 128R, 128G and 128B and three shift registers 104R, 104G and 104B are incorporated in correspondence with the RAMs 116R, 116G and 116B. In FIG. 18, the same parts as in FIG. 12 are denoted by the same reference numerals with only R, G and B added thereto. The parts denoted by similar reference numerals have the same functions, except that the data corresponding to the respective colors red, green and blue of the added symbols is processed, so the description of these parts will be omitted.

FIG. 19 schematically shows a system wherein a number of LED modules 102-11 to 102-MN are mounted to a panel socket to assemble a large-sized display panel unit. As seen from the figure, the system has drivers 100-11 to 100-MN associated with the modules 102-1N to 102-MN. The picture element data is supplied to the associated drivers 100-11 to 100-MN through the data lines 106, and the row current signals are respectively supplied from the drivers 100-11 to 100-MN to the LED modules 102-11 to 102-MN. The writing addresses are similarly supplied to all the drivers from an external unit through the address line 110. These drivers supply scanning signals to all the modules 102-11 to 102-MN to energize them so that the display panel unit displays a predetermined pattern. The control signal is obtained by decoding the serial or parallel command data supplied from an external unit to a decoder 140 through a bus 138 and is supplied to the drivers 100-11 to 100-MN. This control signal allows control such that predetermined modules alone may be displayed. Thus, the data may be obtained from the RAMs of predetermined drivers with this control signal. Since the system shown in FIG. 19 is based on the system shown in FIG. 12, refer to FIG. 12 for details.

According to the embodiment described above, the driver drives the display device with the unit of 16 picture element areas in the column direction and 16 picture element areas in the row direction. Therefore, the system may be of efficient logic construction according to which the driver may be processed with 4-bit binary data. Furthermore, since a maximum current of 15 mA per element is preferable and only 200 to 500 mA is required for the scanning line side, the system may be directly driven with a transistor array configured into a TTLIC or IC so that it may be compact in size. For illumination, about 1 mA/element is obtained with 15 mA/scanning line, so that a luminance which is not obtainable with the conventional system may be obtained.

Since the address signals from an external unit are input to both a static RAM and a decoder, writing may be performed while display is performed. Further, rewriting of the data for only one row may be performed with irregular inputs by suitably supplying the input signals. Thus, efficient data exchange may be accomplished between man and machine. The driver also incorporates an oscillator for display so that data may be written according to an instruction from an external unit regardless of whether the data is input at high speed or at low speed. Input to the memory circuit (static RAM) may be performed through the shift register of serial input and parallel output so that the driver may be provided for external units of general various purposes.

Obviously, numerous modifications and variations of the present invention are possible in light of the above teachings, It is therefore to be understood that within the scope of the appended claims, the invention may be practiced otherwise than as specifically described herein.

What we claim is:

1. An LED module for a flat panel display unit, comprising:
    a rectangular flat substrate having first and second opposed surfaces, wherein said first surface is uniformly divided into a matrix of plural unit areas arranged in rows and columns, each unit area including four picture element areas defining rows and columns of a 2×2 matrix within the matrix of said unit areas;
    plural first column electrodes formed on the substrate, each first column electrode extending along a column of said element areas;
    plural first row electrodes insulated from said first column electrodes, each first row electrode extending along a row of said element areas;
    plural first LED pellets each arranged in a respective element area and each electrically connected to a respective first column electrode and a respective first row electrode;
    plural connecting pads each arranged on a respective unit area, each pad being spaced apart from the LED pellets arranged on the four picture element areas defining its respective unit area; and
    plural connecting pins each secured to the second surface of said substrate to project therefrom, each connecting pin connected electrically to a respective connecting pad.

2. An LED module according to claim 1, wherein said first surface of said substrate is uniformly divided into a matrix of 64 element areas arranged in 8 rows and 8 columns.

3. An LED module according to claim 1, wherein said first LED pellets emit monochromatic light.

4. An LED module according to claim 3, wherein said LED module further comprises:
    plural second row electrodes insulated from said first column electrodes and said first row electrodes and each respectively extending along the row of element areas along which said first row electrodes respectively extend; and
    plural second LED pellets for emitting light of a different color from that emitted by said first LED pellets, each second LED pellet arranged in a respective element area and electrically connected between said first column electrode and said second row electrode.

5. An LED according to claim 4, wherein said first surface of said substrate is uniformly divided into 144 element areas arranged in 12 rows and 12 columns.

6. An LED module according to claim 4, wherein said LED module further comprises:
    plural third row electrodes insulated from said first column electrodes and said first and second row electrodes and each respectively extending along the row of element areas along which said first and second row electrodes respectively extend, and
    plural third LED pellets for emitting light of a different color from that emitted by said first and second LED pellets, each third LED pellets arranged in a respective element area and electrically connected between said first column electrode and said third row electrode.

7. An LED module according to claim 6, wherein said one surface of said substrate is uniformly divided into 256 element areas arranged in 16 rows and 16 columns.

8. An LED module according to claim 1, wherein each of said connecting pads is disposed substantially at the center of its respective unit area.

9. An LED device according to claim 1, wherein each unit area has a respective connecting pad arranged therein.

10. An LED module according to claim 1, wherein each of said connecting pads and each of said connecting pins are connected through a respective through hole formed in said substrate.

11. An LED module according to claim 1, wherein said connecting pins have a pitch equal to 2.54 mm.

12. An LED module according to claim 1, wherein each said element area has dimensions of 1.27 mm × 1.27 mm.

13. An LED module according to claim 1, comprising:
    an insulative layer insulating said first row electrodes from said first column electrodes.

* * * * *